United States Patent
Kim et al.

(10) Patent No.: US 7,084,420 B2
(45) Date of Patent: Aug. 1, 2006

(54) NITRIDE BASED SEMICONDUCTOR DEVICE

(75) Inventors: Sun Woon Kim, Seoul (KR); Dong Hyun Cho, Kyungki-do (KR); Je Won Kim, Kyungki-do (KR); Kyu Han Lee, Kyungki-do (KR); Jeong Tak Oh, Kyungki-do (KR); Dong Joon Kim, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 11/098,278

(22) Filed: Apr. 4, 2005

(65) Prior Publication Data

US 2006/0086932 A1    Apr. 27, 2006

(30) Foreign Application Priority Data

Oct. 26, 2004    (KR) ..................... 10-2004-0085789

(51) Int. Cl.
*H01L 29/06* (2006.01)
*H01L 31/072* (2006.01)
(52) U.S. Cl. .......................................... 257/13; 257/14
(58) Field of Classification Search ............ 257/12–14, 257/79
See application file for complete search history.

(56) References Cited

U.S. PATENT DOCUMENTS 6,337,493 B1 *    1/2002    Tanizawa et al. ............. 257/79
6,737,684 B1 *    5/2004    Takagi et al. ................ 257/194

OTHER PUBLICATIONS

Chen, C. H., Y. K. Su, S. J. Chang, G. C. Chi, J. K. Sheu, J. F. Chen, C. H. Liu, and Y. H. Liaw, IEEE Electron Device Letters, "High Brightness Green Light Emitting Diodes With Charge Asymmetric Resonance Tunneling Structure", vol. 23, No. 3 (Mar. 2002), pp. 130-132.

* cited by examiner

*Primary Examiner*—Phat X. Cao
*Assistant Examiner*—Theresa T. Doan
(74) *Attorney, Agent, or Firm*—Volpe And Koenig, PC

(57) ABSTRACT

The present invention provides a nitride based semiconductor device comprising an active layer having a quantum well layer and a quantum barrier layer, wherein the device includes an electron emitting layer formed of at least two repeats of a first nitride semiconductor layer and a second nitride semiconductor layer having different compositions between a n-type nitride semiconductor layer and the active layer, the first nitride semiconductor layer has an energy band gap greater than that of the quantum well layer, smaller than that of the quantum barrier layer, and decreasing closer to the active layer, and the second nitride semiconductor layer has an energy band gap at least higher than that of the adjacent first nitride semiconductor layer(s) and has a thickness capable of tunneling electrons.

13 Claims, 4 Drawing Sheets

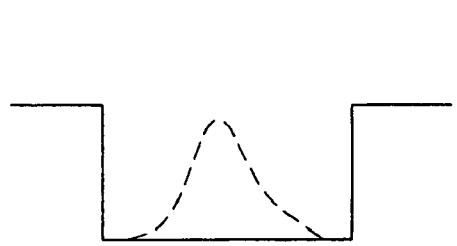
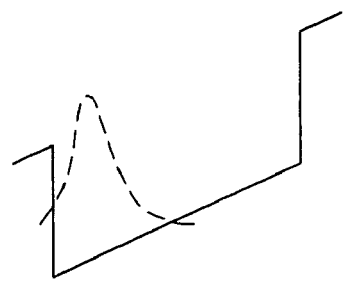
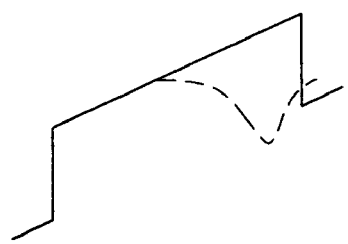
FIG. 1a          FIG. 1b
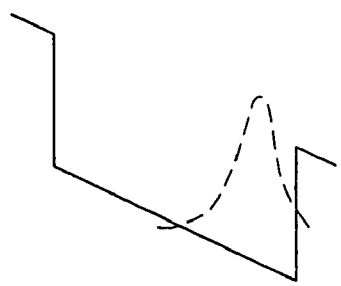
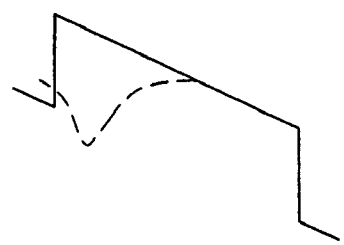
FIG. 1c

NITRIDE BASED SEMICONDUCTOR DEVICE

RELATED APPLICATION

The present application is based on, and claims priority from, Korean Application Number 2004-85789, filed on Oct. 26, 2004, the disclosure of which is incorporated by reference herein in its entirety.

BACKGROUND OF THE INVENTION

1. Field of the Invention

The present invention relates to a nitride based semiconductor device, and more particularly to a high efficiency nitride based semiconductor device having improved internal quantum efficiency, operation voltage, and reverse voltage properties.

2. Description of the Related Art

Generally, nitride based semiconductor devices have been widely used in green light or blue light emitting diodes (LEDs) or laser diodes (LDs) provided as a light source for use in full color displays, image scanners, a variety of signaling systems and optical communication instruments. Such nitride based semiconductor devices include an active layer of a single quantum well (SQW) structure or a multi quantum well (MQW) structure disposed between n- and p-type nitride semiconductor layers, and the active layer produces and emits light according to the principles of recombination between electrons and holes.

Light efficiency of the nitride based semiconductor devices is determined by the probability of recombination between electrons and holes in the active layer, i.e., internal quantum efficiency. Schemes for improving the internal quantum efficiency are largely focused on improving the structure of the active layer or increasing effective mass of carriers.

As such a conventional method for the above-mentioned purpose, reference "ELECTRON DEVICE LETTERS, Vol. 23, No. 3 Mar. 2002, p 130" by IEEE (Institute of Electrical and Electronics Engineers, Inc) has proposed use of a charge asymmetric resonance tunneling structure made of an InGaN/GaN layer below the active layer of the multi quantum well structure. According to the above-mentioned reference, it is stated that luminous efficiency of the nitride based semiconductor device can be improved by introduction of a 50 nm thick InGaN layer and a 1 nm thick GaN layer so as to inject electrons accumulated in the InGaN layer into the active layer by tunneling, leading to decrease of operation current and voltage. In this manner, the InGaN layer and GaN layer increase effective mass of electrons which is usually lower than that of holes by taking advantage of the tunneling effect and thereby can effectively serve as an electron emitting layer which increases the probability of carrier capture in the active layer.

However, the above-mentioned method still suffers from a problem of lowering recombination efficiency between electrons and holes due to piezoelectric field. That is, difference of lattice constants between the active layer and adjacent clad layer produces stress that in turn is applied to the active layer thus forming the piezoelectric field.

Referring to an energy band diagram of the active layer under conditions of no stress, as shown in FIG. 1a, a wave function of electrons and holes is practically symmetrical. However, when compressive stress or tensile stress acts due to the difference of lattice constants between the active layer and clad layer, as shown in FIGS. 1b and 1c, the piezoelectric field is formed as represented by the arrows and a phenomenon occurs wherein the distance between wave functions of electrons and holes in the active layer become more distant. Therefore, even though the effective mass of carrier injected increases, the recombination probability between electrons and holes does not substantially increase, thus leading to deterioration of luminous efficiency of the optical device. Further, because of increased current due to increased distance between wave functions, emitted light is shifted to a short wavelength region.

There remains a need in the art for a novel method of solving problems associated with deterioration of luminous efficiency and wavelength shift of emitted light due to the piezoelectric field.

SUMMARY OF THE INVENTION

Therefore, the present invention has been made in view of the above problems, and it is an object of the present invention to provide a high efficiency nitride based semiconductor device having alleviated piezoelectric field effects by forming an electron emitting layer of a multi-structure for tunneling effects, between an active layer and n-type clad layer while controlling an energy band gap size of each layer.

In accordance with the present invention, the above and other objects can be accomplished by the provision of a nitride based semiconductor device comprising an n-type nitride semiconductor layer, a p-type nitride semiconductor layer, and an active layer formed between the p-type nitride semiconductor layer and n-type nitride semiconductor layer and having a quantum well layer and a quantum barrier layer, wherein the device includes an electron emitting layer formed of at least two repeats of first nitride semiconductor layers and second nitride semiconductor layers having different compositions, disposed between the n-type nitride semiconductor layer and the active layer, the first nitride semiconductor layers have an energy band gap greater than that of the quantum well layer, smaller than that of the quantum barrier layer, and decreasing closer to the active layer, the second nitride semiconductor layers have an energy band gap at least higher than that of the adjacent first nitride semiconductor layer(s), and the respective layers have a thickness capable of tunneling electrons.

The second nitride semiconductors layer may have almost the same energy band gap as that of the quantum barrier layer. Preferably, the first nitride semiconductor layers of the electron emitting layer have a thickness of 1 to 100 nm, respectively. The second nitride semiconductor layers have a thickness of 0.5 to 10 nm, respectively.

In a specific embodiment of the present invention, at least one layer of the first and second nitride semiconductor layers of the electron emitting layer may be doped with an n-type impurity.

In one embodiment of the present invention, the active layer may have a multi quantum well structure in which the quantum well layer of the formula $In_xGa_{1-x}N$ (0<x<1) and the quantum barrier layer of GaN are repeatedly formed at least two times. In this embodiment, preferably, the electron emitting layer is formed of at least two repeats of the first nitride semiconductor layers of the formula $In_yGa_{1-y}N$ (0<y<1) having different In contents and the second nitride semiconductor layers of GaN. The first nitride semiconductor layers may have a lower In content than the quantum well layer and increasing closer to the active layer.

Also in this embodiment, at least one layer of the first and second nitride semiconductor layers may be doped with an n-type impurity. The n-type impurity concentration in the first and second nitride semiconductor layers may be designed to have gradual variation. That is, the concentration of the n-type impurity may become lower or higher closer to the active layer.

In this case, the n-type nitride semiconductor layer may also have a tendency of the same increase or decrease of doping concentration. That is, the concentration of impurities in the n-type nitride semiconductor layer may be lower or higher than that of the adjacent first nitride semiconductor layer.

BRIEF DESCRIPTION OF THE DRAWINGS

The above and other objects, features and other advantages of the present invention will be more clearly understood from the following detailed description taken in conjunction with the accompanying drawings, in which:

FIGS. 1a through 1c are, respectively, graphs showing energy band diagrams and wave functions of electrons and holes, for illustrating effects of the piezoelectric field, respectively;

DESCRIPTION OF THE PREFERRED EMBODIMENTS

The present invention will now be described in more detail with reference to the accompanying drawings and specific embodiments.

Figure 2A:
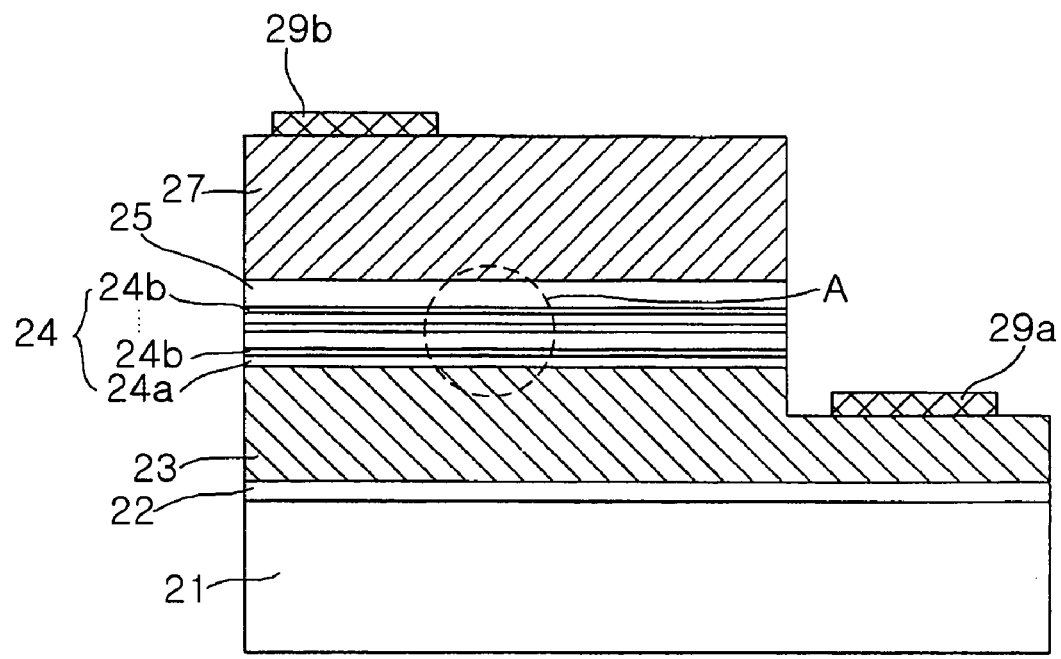
FIGS. 2a and 2b are, respectively, a cross-sectional view and a partial detail view of a nitride based semiconductor device in accordance with one embodiment of the present invention.
Figure 2B:
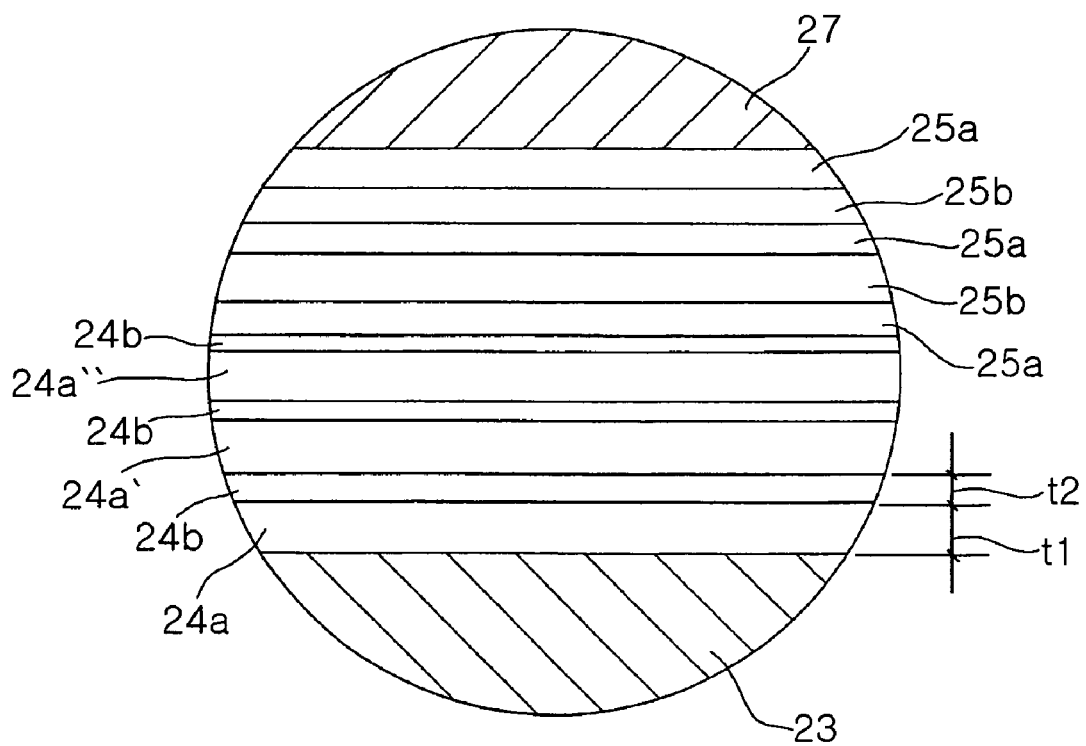

FIG. 2a is a cross-sectional view of a nitride based semiconductor device in accordance with one embodiment of the present invention and FIG. 2b is a partial detail view of the enlarged part A of FIG. 2a.

First, referring to FIG. 2a, a nitride based semiconductor device 20 includes an n-type nitride semiconductor layer 23, an active layer 25 and a p-type nitride semiconductor layer 27 sequentially formed on a substrate 21 in which a buffer layer 22 was formed. The substrate 21 may be a substrate made of heterologous materials such as sapphire and SiC or a substrate made of a homogeneous material such as GaN. An n-electrode 29a and a p-electrode 29b are provided on the exposed upper surface of the n-type nitride semiconductor layer 23, and the p-type nitride semiconductor layer 27, respectively.

The nitride based semiconductor device 20 in accordance with the present invention includes an electron emitting layer 24 formed of at least 2 repeats of a first nitride semiconductor layer 24a and a second nitride semiconductor layer 24b having different compositions, disposed between the n-type nitride semiconductor layer 23 and active layer 25. The electron emitting layer 24 employed in this embodiment may have a multi-layer structure including each of three first and second nitride semiconductor layers 24a and 24b alternately formed thereon. In addition, the respective layers 24a and 24b in the electron emitting layer 24 are configured to have an energy band gap suitable for maximizing tunneling effects and simultaneously the alleviating piezoelectric field effect.

More specifically, referring to FIG. 2b, the first nitride semiconductor layers 24a, 24a' and 24a" have an energy band gap greater than that of a quantum well layer 25a of the active layer 25, but smaller than that of a quantum barrier layer 25b. The second nitride semiconductor layer 24b has an energy band gap at least higher than that of the adjacent first nitride semiconductor layers 24a, 24a' and 24a" and may have almost the same energy band gap as the quantum barrier layer 25b.

Further, the first nitride semiconductor layers 24a, 24a' and 24a" in accordance with the present invention are arranged to have an energy band gap which becomes smaller closer to the active layer 25, such that the lattice constant difference between layers from the n-type nitride semiconductor layer 23 to the active layer 25 can be alleviated. That is, the first nitride semiconductor layer 24a' disposed in the middle has an energy band gap smaller than the first nitride semiconductor layer 24a disposed on the n-type nitride semiconductor layer 23, but greater than the first nitride semiconductor layer 24a" closest to the active layer 25.

Therefore, such configuration may reduce the influence of the piezoelectric field effect, thus inhibiting increase of distance of wave function of electrons and holes and thus decreasing a width of changes in wavelength due to increase of operation current. In addition, since the electron emitting layer 24 of the present invention employs a plurality of tunneling structures (three tunneling structures in this embodiment), it is possible to significantly increase the effective mass of electrons injected to the active layer 25, thereby further improving luminous efficiency.

For such tunneling effect, the second nitride semiconductor layer 24b has the thickness t2, such that electrons accumulated in the first nitride semiconductor layers 24a, 24a' and 24a" can be tunneled toward the active layer 25. The preferred thickness t2 of the second nitride semiconductor layer 24b ranges from 0.5 to 10 nm. Further, The thickness t1 of the first nitride semiconductor layers 24a, 24a' and 24a" preferably ranges from 1 to 100 nm. In order to more effectively alleviate piezoelectric field, the first nitride semiconductor layers 24a, 24a' and 24a" preferably have a thickness increasing closer to the active layer 25. That is, the first nitride semiconductor layer 24a' disposed in the middle may have a thickness greater than the first nitride semiconductor layer 24a disposed on the n-type nitride semiconductor layer 23, but smaller than the first nitride semiconductor layer 24a" closest to the active layer 25.

The first and second nitride semiconductor layers employed in the present invention may be made of undoped layers like the active layer, but alternatively at least one layer or all the layers may be doped with the n-type impurities. Where a plurality of the first and second nitride semiconductor layers are doped, nitride semiconductor layers may be formed to have higher or lower impurity concentration closer to the active layer. In addition, tendency of same increase or decrease in doping concentration can be effected by forming the n-type nitride semiconductor layer so as to have an impurity concentration lower or higher than that of the adjacent first nitride semiconductor layer.

In a specific embodiment of the present invention, the active layer may have a multi quantum well structure formed of at least two repeats of the quantum well layer of the formula $In_xGa_{1-x}N$ (0<x<1) and the quantum barrier layer of GaN. In this case, the first nitride semiconductor layer may be of the formula $In_yGa_{1-y}N$ (0<y<1) having different In content, and the second nitride semiconductor layer may be of GaN.

Figure 3:
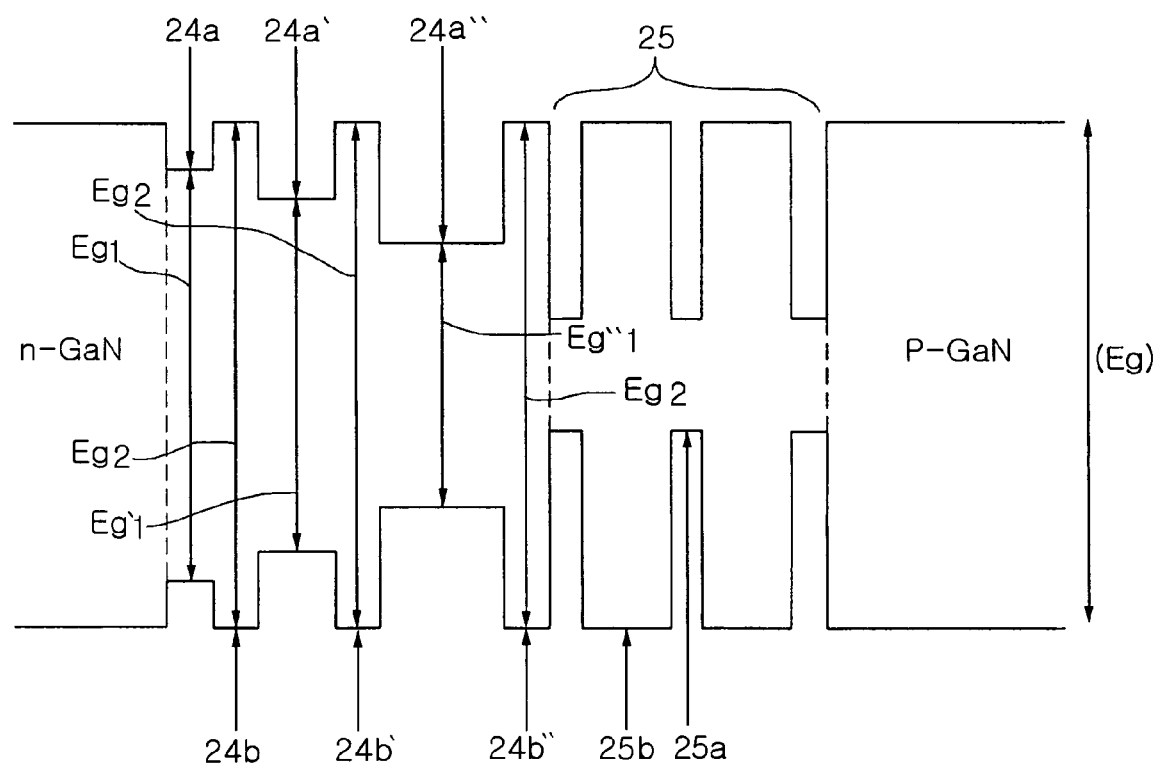
FIG. 3 is a schematic diagram showing an energy band diagram for FIG. 2b.

FIG. 3 shows an energy band diagram of an electron emitting layer and active layer in a nitride based semiconductor device having a multi quantum well structure of InGaN/GaN and similar to a structure in FIGS. 2a and 2b.

The first nitride semiconductor layers 24a, 24a' and 24a" are of the formula $In_yGa_{1-y}N$ (0<y<1) having different In content, but are arranged such that their energy band gaps are greater than the energy band gap of the quantum well layer 25a of GaN in the active layer 25, but smaller than that of the quantum barrier layer 25b, and becoming smaller closer to the active layer 25. That is, the first nitride semiconductor layers 24a, 24a' and 24a" have an arrangement satisfying $E_{g1}"<E_{g1}'<E_{g1}$. This arrangement can be easily realized by controlling the In content such that In content of the first nitride semiconductor layers 24a, 24a' and 24a" is smaller than that of the quantum well layer 25a and increases closer to the active layer 25. Further, in order to more effectively alleviate the piezoelectric field, the first nitride semiconductor layers 24a, 24a' and 24a" may have a thickness becoming greater closer to the active layer 25.

The second nitride semiconductor layer 24b has an energy band gap ($E_{g2}$) at least higher than that of the adjacent first nitride semiconductor layers 24a, 24a' and 24a", and may have almost the same energy band gap as that of the quantum barrier layer 25b, as shown in FIG. 3. That is, the second nitride semiconductor layer 24b may be formed of the same GaN layer as the quantum barrier layer 25b.

EXAMPLES

Example 1

In order to confirm improvement effects of a nitride based semiconductor device in accordance with the present invention on the piezoelectric field, a nitride light emitting diode (LED) was prepared in a reactor under an atmosphere of ammonia ($NH_3$) using trimethyl gallium (TMGa) and trimethyl Indium (TMIn) by MOCVD.

First, a GaN low temperature nucleus-growth layer was formed on a sapphire substrate, and then Si was used to form an n-type GaN layer having an impurity concentration of $4 \times 10^{18}/cm^3$ and a thickness of 3 μm Next, as presented in the present invention, a first nitride semiconductor layer satisfying a formula $In_yGa_{1-y}N$ (0<y<1) and a second nitride semiconductor layer of GaN were repeatedly and alternately formed three times to prepare an electron emitting layer. At this time, the first nitride semiconductor layers were formed such that the respective molar ratio (y) of In is 0.05, 0.08 and 0.11 in order away from the active layer and the respective thicknesses were 15 nm, 30 nm and 45 nm. The second nitride semiconductor layers were formed in the same thickness of 1 nm.

Next, the active layer was formed on the n-type GaN layer. The active layer was formed to have a multi quantum well structure made of 5 pairs of an InGaN quantum well layer and GaN quantum barrier layer alternately formed to each other. At this time, each quantum well layer was formed of $In_{0.25}Ga_{0.75}N$ having a thickness of 3 nm, and each quantum barrier layer was formed of GaN having a thickness of 10 nm.

On the active layer was formed a p-type GaN layer having an impurity concentration of about $5 \times 10^{17}/cm^3$ and a thickness of about 0.3 μm. After appropriate mesa etching, p- and n-electrodes were formed.

Comparative Example 1

A nitride based semiconductor device was prepared under the same conditions as Example 1, except that an active layer was formed on an n-type GaN layer without formation of an electron emitting layer employed in the present invention.

Comparative Example 2

A nitride based semiconductor device was prepared under the same conditions as Example 1, except that a conventional single electron emitting layer was employed instead of a multi electron emitting layer structure employed in the present invention. The conventional electron emitting layer was formed of an $In_{0.1}Ga_{0.9}N$ layer having a thickness of 50 nm, as suggested in the above-mentioned literature, and a GaN layer was formed thereon in a thickness of 1 nm.

Figure 4:
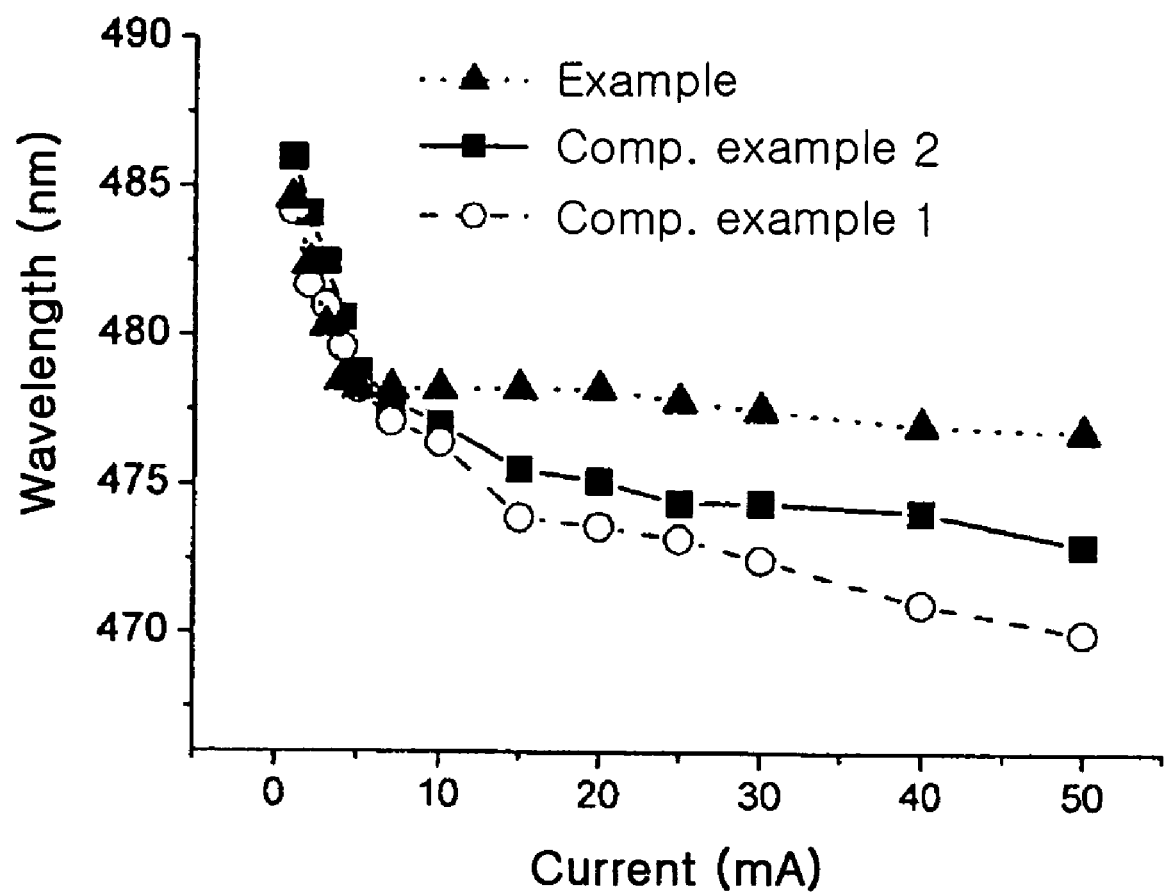
FIG. 4 is a graph showing changes in wavelength of emission light with respect to current increase, in a nitride based semiconductor device in accordance with the present invention and a conventional nitride based semiconductor device.

Using the nitride based semiconductor devices obtained in Example 1 and Comparative Examples 1 and 2, changes in wavelength of the emitted light were confirmed with gradual increase of current from 0 up to 50 mA. FIG. 4 shows a graph of the observed results.

As shown in FIG. 4, it is confirmed that when increasing current from 10 mA to 50 mA, wavelength of the emitted light was lowered from 477 nm to 470 nm, with a change of about 7 nm in Comparative Example 1, and also in Comparative Example 2, it was lowered from 477 nm to 473 nm, with a change of about 4 nm. Whereas, in Example 1 in accordance with the present invention, it was observed that under the same condition, wavelength of the emitted light was lowered from 478 nm to 477 nm, with a change of only about 1 nm.

Such a degree of wavelength changes with increase of current occurred due to the distance difference of wave functions of electrons and holes by piezoelectric field. Therefore, it can be understood that there is a large distance difference of the wave function in Comparative Examples 1 and 2, but in the present invention, such difference is significantly reduced and thus effects of the piezoelectric field are very slight.

As such, the multi electron emitting layer structure in accordance with the present invention can significantly alleviate the effects of the piezoelectric field, and can greatly improve electron injection efficiency through the multi tunneling structure. Therefore, it is possible to decrease changes in wavelength with increase of current and at the same time, remarkably improve luminous efficiency.

Although the above-mentioned Example 1 was illustrated by way of the nitride based light emitting diode, it will be apparent to those skilled in the art that the present invention is applicable to other nitride based optical devices having a similar structure such as a semiconductor laser diode.

As apparent from the above description, in accordance with the present invention, there is provided an electron emitting layer having a multi structure between an active layer and n-type nitride semiconductor layer, and thereby it is possible to maximize tunneling effects, thus significantly improving current injection efficiency, and also reduce the effects of the piezoelectric field, thus remarkably improving luminous efficiency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A nitride based semiconductor device comprising an n-type nitride semiconductor layer, a p-type nitride semiconductor layer, and an active layer formed between the p-type nitride semiconductor layer and n-type nitride semiconductor layer and having a quantum well layer and a quantum barrier layer, wherein the device includes an electron emitting layer formed of at least two repeats of first nitride semiconductor layers and second nitride semiconductor layers having different compositions, disposed between the n-type nitride semiconductor layer and the active layer, the first nitride semiconductor layers have an energy band gap greater than that of the quantum well layer, smaller than that of the quantum barrier layer, and decreasing closer to the active layer, and the second nitride semiconductor layers have an energy band gap at least higher than that of the adjacent first nitride semiconductor layer(s) and have a thickness such that electrons accumulated in the first nitride semiconductor layer can be tunneled toward the active layer.

2. The nitride based semiconductor device as set forth in claim 1, wherein the second nitride semiconductor layers have almost the same energy band gap as that of the quantum barrier layer.

3. The nitride based semiconductor device as set forth in claim 1, wherein the first nitride semiconductor layers of the electron emitting layer have a thickness of 1 to 100 nm, respectively.

4. The nitride based semiconductor device as set forth in claim 3, wherein the thickness of the first nitride semiconductor layers increases closer to the active layer.

5. The nitride based semiconductor device as set forth in claim 1, wherein the second nitride semiconductor layers of the electron emitting layer have a thickness of 0.5 to 10 nm, respectively.

6. The nitride based semiconductor device as set forth in claim 1, wherein at least one layer of the first and second nitride semiconductor layers of the electron emitting layer is doped with an n-type impurity.

7. The nitride based semiconductor device as set forth in claim 6, wherein the n-type impurity concentration in the first and second nitride semiconductor layers of the electron emitting layer increases or decreases closer to the active layer.

8. The nitride based semiconductor device as set forth in claim 7, wherein the impurity concentration in the n-type nitride semiconductor layer is higher or lower than that of the adjacent first nitride semiconductor layer.

9. The nitride based semiconductor device as set forth in claim 1, wherein the active layer has a multi quantum well structure in which the quantum well layer of the formula $In_xGa_{1-x}N$ (0<x<1) and the quantum barrier layer of GaN are repeatedly formed at least two times.

10. The nitride based semiconductor device as set forth in claim 9, wherein the electron emitting layer is formed of at least two repeats of the first nitride semiconductor layers of the formula $In_yGa_{1-y}N$ (0<y<1) having different In content, and the second nitride semiconductor layers of GaN, and the first nitride semiconductor layers have a lower In content than the quantum well layer and increasing closer to the active layer.

11. The nitride based semiconductor device as set forth in claim 10, wherein at least one layer of the first and second nitride semiconductor layers is doped with an n-type impurity.

12. The nitride based semiconductor device as set forth in claim 10, wherein the n-type impurity concentration in the first and second nitride semiconductor layers increases or decreases closer to the active layer.

13. The nitride based semiconductor device as set forth in claim 10, wherein the impurity concentration in the n-type nitride semiconductor layer is lower or higher than that of the adjacent first nitride semiconductor layer.

* * * * *